(12) United States Patent
Hase

(10) Patent No.: US 7,781,319 B2
(45) Date of Patent: Aug. 24, 2010

(54) METHOD OF MANUFACTURING SEMICONDUCTOR DEVICE

(75) Inventor: Takashi Hase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 201 days.

(21) Appl. No.: 12/048,265

(22) Filed: Mar. 14, 2008

(65) Prior Publication Data

US 2008/0227279 A1 Sep. 18, 2008

(30) Foreign Application Priority Data

Mar. 14, 2007 (JP) ............................. 2007-065216

(51) Int. Cl.
H01L 21/3205 (2006.01)
H01L 21/4763 (2006.01)
H01L 21/336 (2006.01)
H01L 21/8234 (2006.01)
(52) U.S. Cl. ..................... 438/585; 438/197; 438/257; 438/592
(58) Field of Classification Search ................. 438/585, 438/197, 587, 664, 218, 299, 257, 199, 592, 438/581, 655, 549, 514, 630, 721, 682
See application file for complete search history.

(56) References Cited

U.S. PATENT DOCUMENTS

2006/0263961 A1* 11/2006 Kittl et al. .................. 438/199

2007/0026600 A1* 2/2007 Komori ...................... 438/199

FOREIGN PATENT DOCUMENTS

JP 2006-100431 A 4/2006

OTHER PUBLICATIONS

Kensuke Takahashi et al., "Dual Workfunction Ni-Silicide/HfSiOn Gate Stacks by Phase-Controlled Full-Silicidation (PC-FUSI) Technique for 45nm-node LSTP and LOP Devices", 2004, pp. 1-4.
Yoshinori Tsuchiya et al., "Physical Mechanism of Work Function Modulation due to Impurity Pileup at Ni-FUSI/SiO (N) Interface", 2005, pp. 1-4.
A. Veloso et al., "Dual work function phase controlled Ni-FUSI CMOS (NiSi NMOS, Ni2Si or Ni31Si12 PMOS): Manufacturability, Reliability & Process Window Improvement by Sacrificial SiGe cap", 2006, Sympoisum on VLSI Technology Digest of Technical Papers, pp. 1-2.
Masayuki Terai et al., "Highly Reliable HfSiON CMOSFET with Phase Controlled NiSi (NFET) and Ni3Si (PFET) FUSI Gate Electrode", 2005, Symposium on VLSI Technology Digest of Technical Papers, pp. 1-2.
A. Lauwers et al., "CMOS Integration of Dual Work Function Phase Controlled Ni FUSI with Simultaneous of NMOS (NiSi) and PMOS (Ni-rich silicide) gates on HfSiON", 2005 IEEE, pp. 1-4.

* cited by examiner

Primary Examiner—Chuong A. Luu
(74) Attorney, Agent, or Firm—Young & Thompson

(57) ABSTRACT

According to the present invention, it is provided a method of manufacturing a semiconductor device comprising a PMOS transistor and a NMOS transistor, wherein the method facilitates obtaining a FUSI phase of a suitable composition for the NMOS transistor and the PMOS transistor respectively, with fewer mask layers and through a fewer number of manufacturing steps.

15 Claims, 10 Drawing Sheets

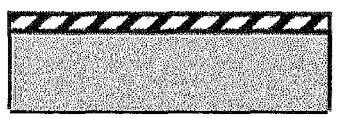
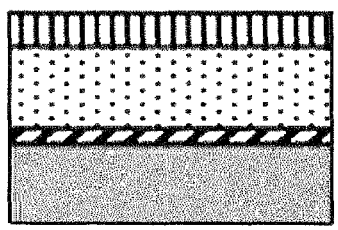
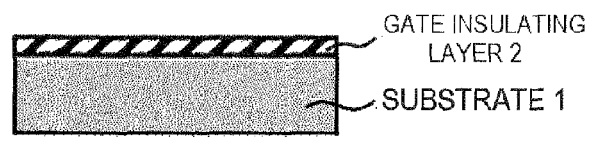
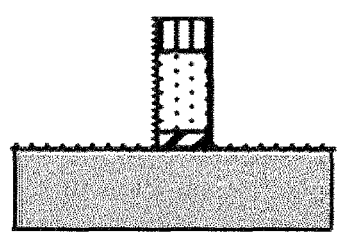
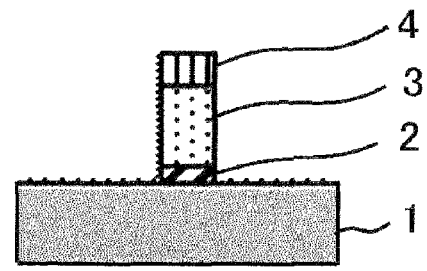
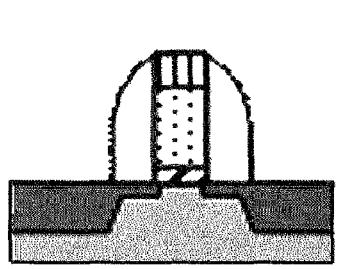
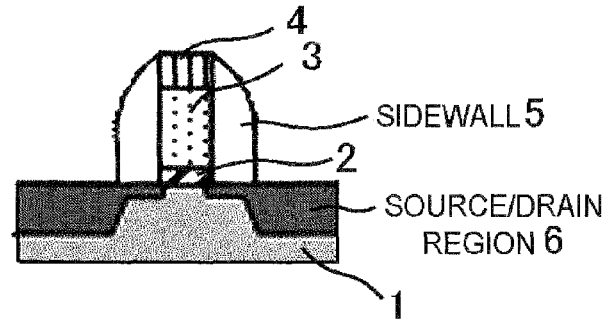
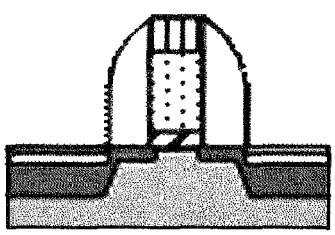
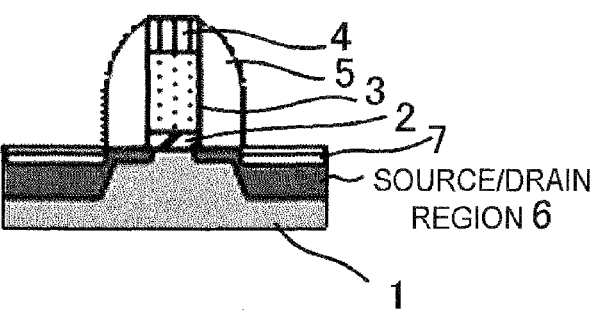

INTERLAYER FILM 8

ION-IMPLANTATION
ION-IMPLANTED REGION 9

RESIST 10
SELECTIVELY ETCHED-BACK PORTION

Ni 11

Ni-RICH FUSI ELECTRODE 12
Si-RICH FUSI ELECTRODE 13

FIG. 3
| WITHOUT ETCH-BACK | WITH ETCH-BACK |
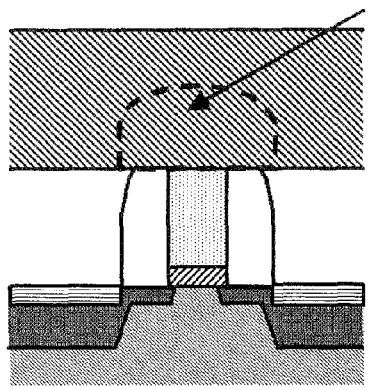
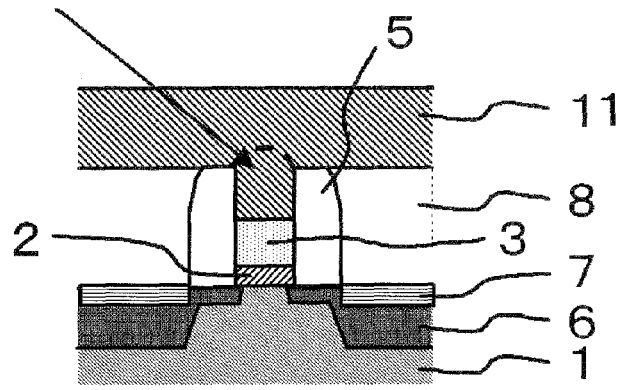
(i)   (ii)
⇩ FULL SILICIDATION
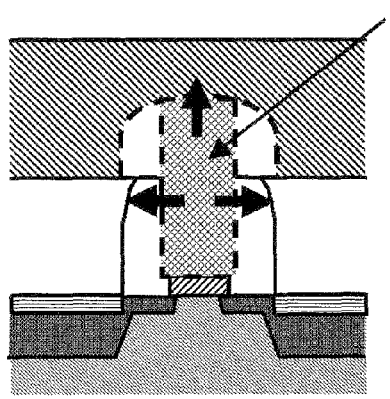
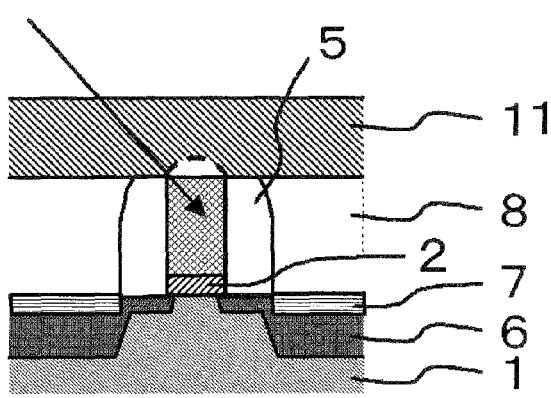
(iii)   (iv)

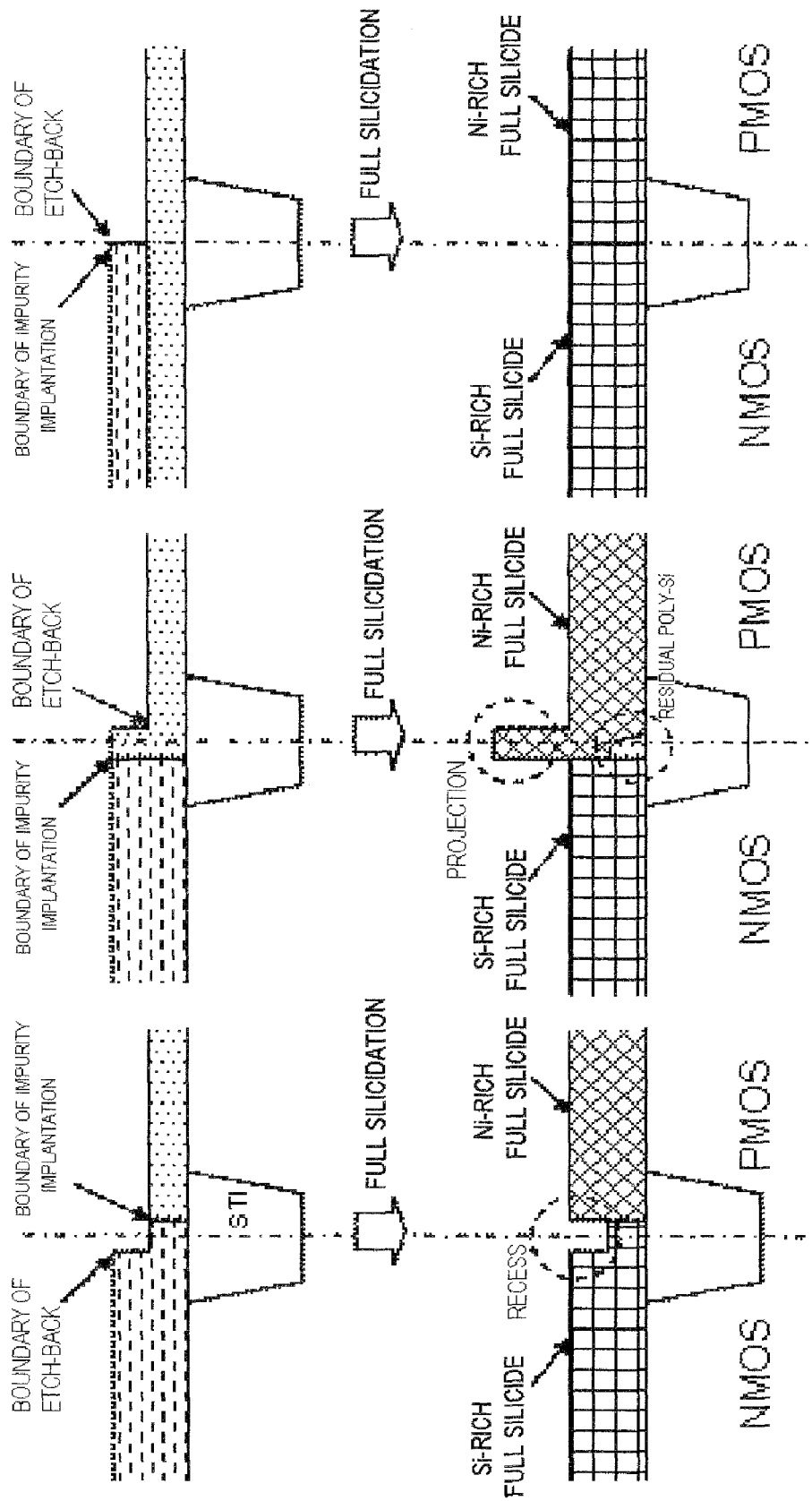

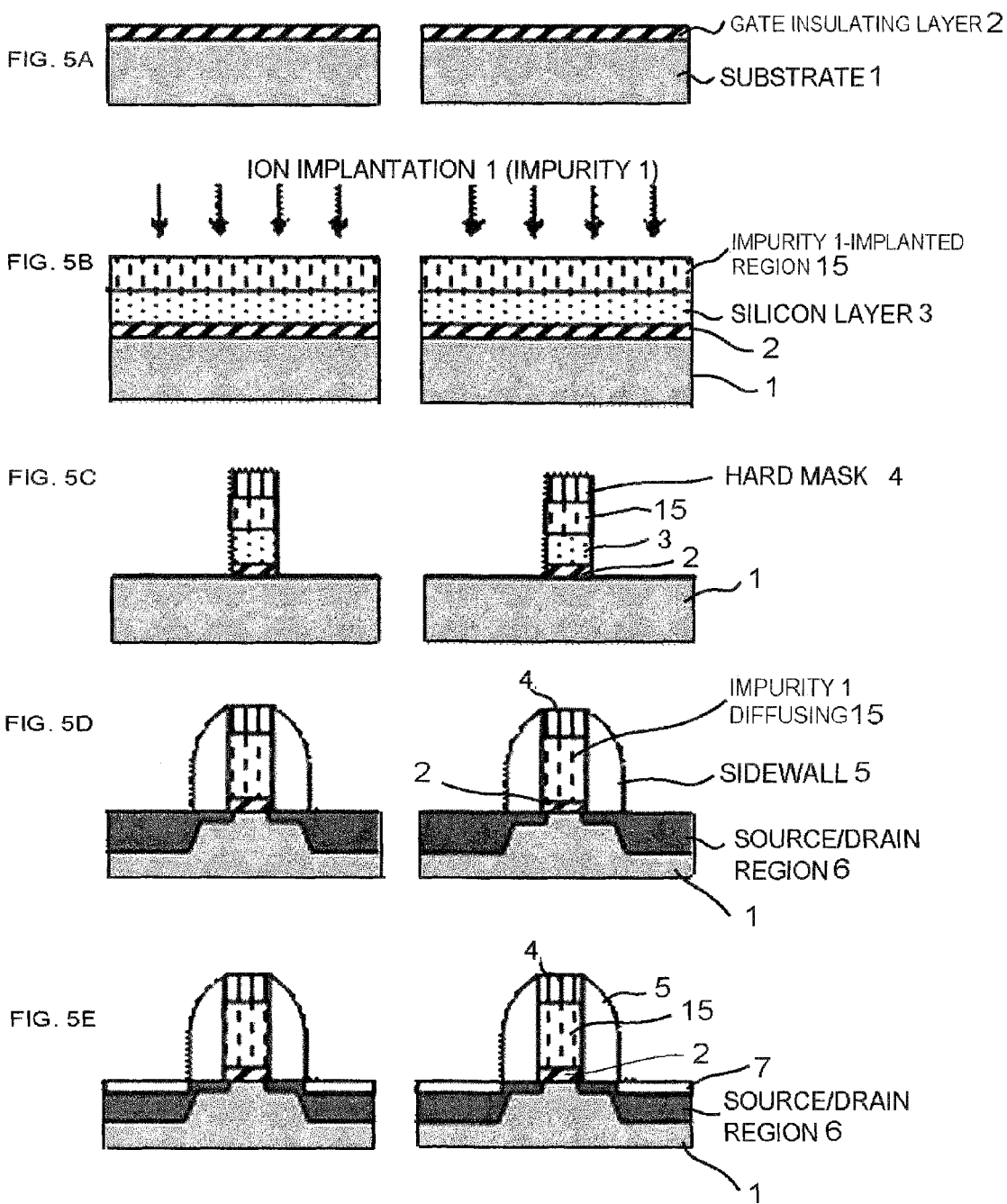

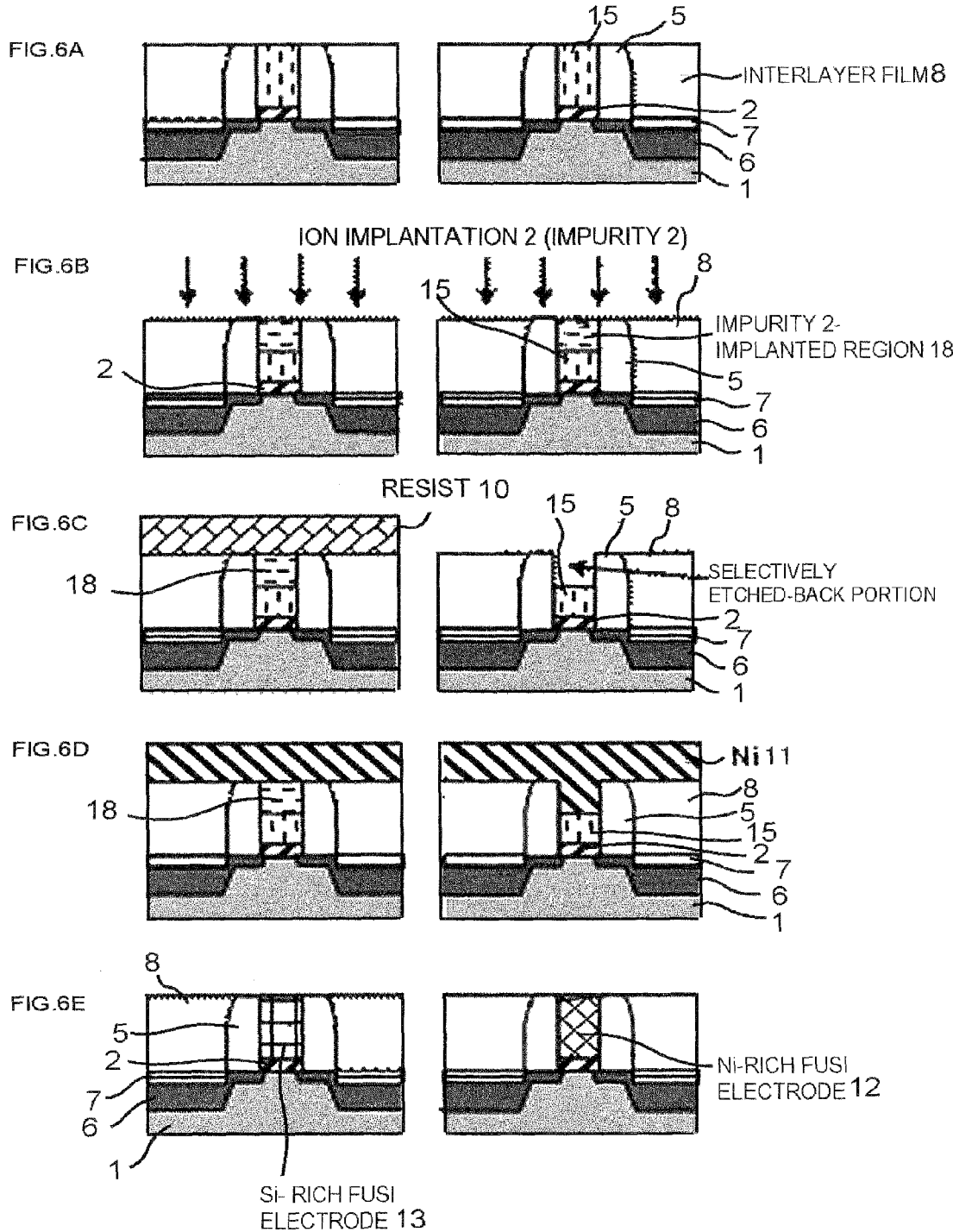

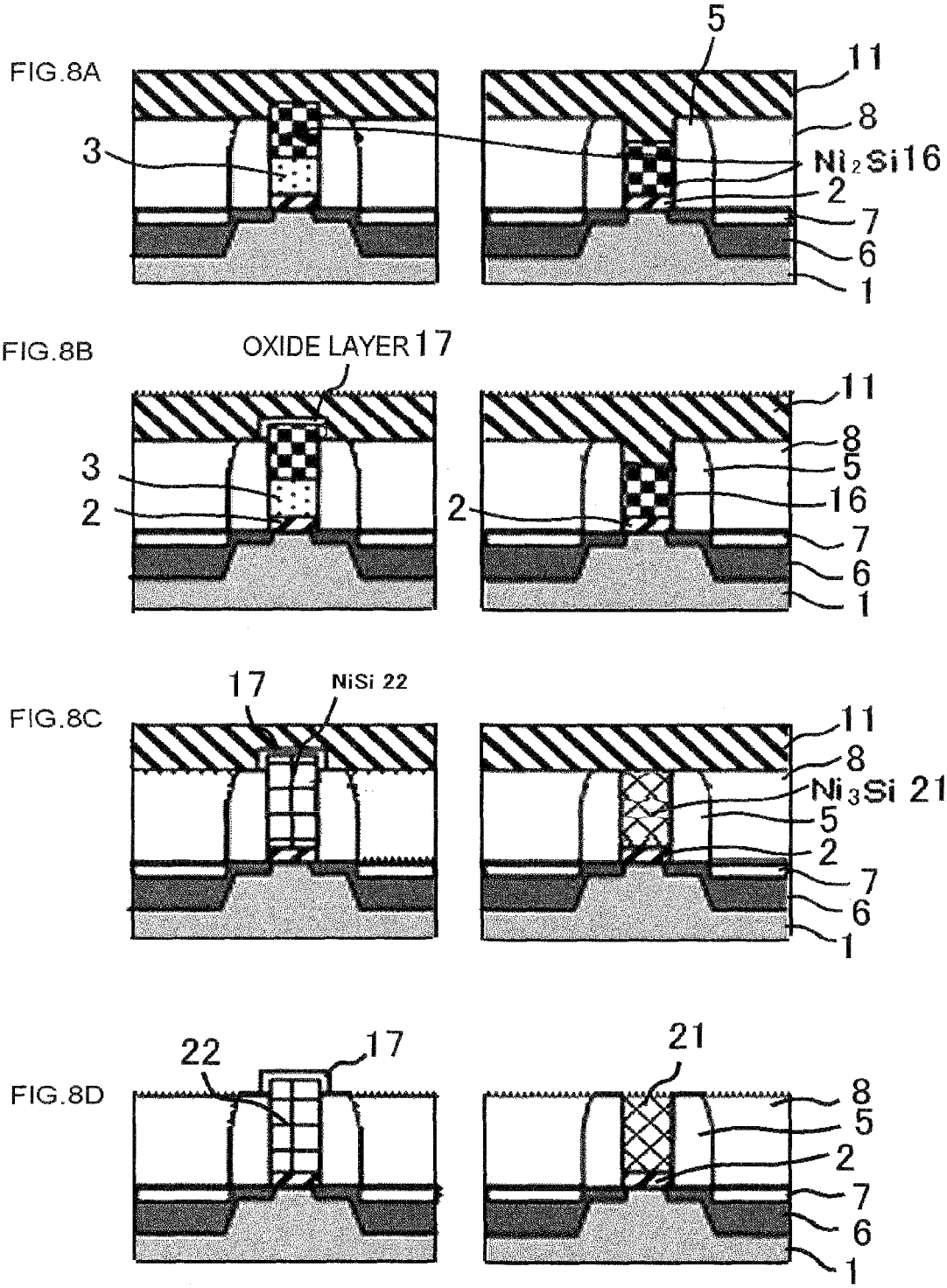

METHOD OF MANUFACTURING SEMICONDUCTOR DEVICE

This application is based on Japanese patent application No. 2007-065216, the content of which is incorporated hereinto by reference.

BACKGROUND

1. Technical Field

The present invention relates to a method of manufacturing a semiconductor device, and more particularly to a method of manufacturing a semiconductor device that includes a metal-insulator-semiconductor (hereinafter, MIS) structure such as a field effect transistor.

2. Related Art

Investigations are being made on techniques for executing work function control or composition control of a gate electrode of a PMOS and NMOS transistor, in the attempt to better control the threshold voltage of the PMOS and NMOS transistor, which is essential for properly driving the transistor. Also, use of a metal electrode for preventing depletion of the gate electrode is currently focused on, and in particular the technique of forming a fully silicided (hereinafter, FUSI) gate electrode, which is a gate electrode turned into silicide down to the interface with the gate insulating layer, is being widely studied, because of the consistency with the manufacturing process so far developed.

In Japanese Laid-Open Patent Publication No. 2006-100431, it is disclosed a method of manufacturing a semiconductor device including employing polycrystalline silicon to form a gate electrode for the PMOS and the NMOS on a gate oxide nitride layer (SiON), implanting as impurity boron (B) into the gate electrode for the PMOS and arsenic (As) into the gate electrode for the NMOS respectively through a resist mask, and depositing Ni on the gate electrode for full silicidation thereof. Distributing the impurity on the interface between the gate oxide nitride layer and the FUSI gate electrode is intended for controlling the work function.

It is disclosed in IEEE 2005 "Physical Mechanism of Work Function Modulation due to Impurity Pileup at Ni-FUSI/SiO(N) Interface", that the composition and orientation of the silicide phase depend on the impurity implanted in advance into the polysilicon before the silicidation process.

In IEDM 2004 "Dual Work function Ni-Silicide/HfSiON Gate Stacks by Phase-Controlled Full-Silicidation (PC-FUSI) Technique for 45 nm-node LSTP and LOP Devices", and Symposium on VLSI Technology Digest of Technical Papers 2005 "Highly Reliable HfSiON CMOSFET with Phase Controlled NiSi (NFET) and Ni3Si (PFET) FUSI Gate Electrode", phase of the FUSI gate electrodes are appropriately controlled for the PMOS transistor and the NMOS transistor by changing Ni film thickness when forming the FUSI gate electrodes on HfSiON gate insulating films. With this structure, the threshold voltage of the CMOS can be appropriately controlled.

In Symposium on VLSI Technology Digest of Technical Papers 2006 "Dual Work function Phase Controlled Ni-FUSI CMOS (NiSi NMOS, Ni2Si or Ni31Si12 PMOS): Manufacturability, Reliability & Process Window Improvement by Sacrificial SiGe cap", and IEEE 2005 "CMOS Integration of Dual Work Function Phase Controlled Ni FUSI with Simultaneous Silicidation of NMOS (NiSi) and PMOS (Ni-rich silicide) Gates on HfSiON", the formation of FUSI electrodes having appropriate silicide phase by performing an etch back of the poly-silicon of the PMOS transistor to suppress the volume expansion at the time of forming Ni rich silicide. In these documents, impurity is not introduced into the gate electrodes and the composition of silicide phase is controlled by the thickness ratio of the Ni layer and the poly-silicon layer. In these documents, HfSiON is used as gate insulating films.

It has now been discovered by the inventor that it takes a complicated process to form the NMOS and the PMOS gate electrode from polysilicon and to properly form the silicide phase in the respective gate electrode, to thereby obtain the NMOS and the PMOS including the FUSI gate electrode. In the case of combining the composition control of the FUSI phase by impurity implantation with the etch-back process on the PMOS side, the boundary of the implantation and that of the etch-back do not coincide, which incurs insufficient stability in structure and composition in the vicinity of the boundary between the n and p gate electrodes. Such drawback is prominently observed especially when HfSiON is employed as the gate insulating layer.

The present invention has been accomplished in view of the foregoing situation, and provides a method of manufacturing a semiconductor device that facilitates obtaining a FUSI phase of a suitable composition for a NMOS transistor and a PMOS transistor respectively, with fewer mask layers and through a fewer number of manufacturing steps.

SUMMARY

In one embodiment, there is provided a method of manufacturing a semiconductor device comprising a PMOS transistor and a NMOS transistor, comprising: forming a silicon layer over a substrate through a gate insulating film; forming a first gate electrode and second gate electrode by patterning said silicon layer, said first gate electrode being a gate electrode of said NMOS transistor, and said second gate electrode being a gate electrode of said PMOS transistor; forming an interlayer film covering said first and said second gate electrodes; planarizing said interlayer film; removing an upper portion of said interlayer film to expose said silicon layer of said first and said second gate electrodes; selectively removing an upper portion of said second gate electrode, out of said first and said second gate electrodes; forming a metallic layer formed of a metal capable of forming a silicide over said silicon layer of said selectively removed second gate electrode and said silicon layer of said first gate electrode; performing a heat treatment such that a silicide layer of said metallic layer is formed; and removing an unreacted portion of said metallic layer after said heat treatment process; wherein said selectively removing an upper portion of said second gate electrode is preceded by simultaneously introducing impurity for controlling composition of a silicide phase, into said silicon layer of said first and said second gate electrode respectively.

The manufacturing method includes introducing impurity for controlling the composition of the silicide phase, into the silicon layer of the gate electrode for the PMOS and the NMOS respectively, at a time. Such process allows forming the gate electrode for the PMOS and the NMOS of a FUSI gate structure including HfSiON as the gate insulating layer, while controlling the composition of the FUSI phase, with fewer masks and through a fewer number of manufacturing steps. Combining thus the composition control of the FUSI phase by impurity implantation with the selective removal of the gate electrode on the PMOS side provides stabilized structure and composition in the vicinity of the boundary between the n and p gate electrodes, because the boundary of the impurity-doped regions coincides with that of the selectively removed region.

Thus, the present invention provides a method of manufacturing a semiconductor device that facilitates obtaining a FUSI phase of a suitable composition for a NMOS transistor and a PMOS transistor respectively, with fewer mask layers and through a fewer number of manufacturing steps.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 1E are cross-sectional views sequentially showing a manufacturing process of a semiconductor device, according to a first embodiment of the present invention;

FIG. 3 includes cross-sectional views showing the effect of a selective etch-back process performed on polycrystalline silicon on the PMOS side, according to the present invention;

FIGS. 4A to 4C are cross-sectional views showing shapes of junction interfaces in NMOS/PMOS gate electrodes according to the present invention and conventional ones;

FIGS. 5A to 5E are cross-sectional views sequentially showing a manufacturing process of a semiconductor device, according to a second embodiment of the present invention;

FIGS. 6A to 6E are cross-sectional views sequentially showing a manufacturing process of a semiconductor device, according to the second embodiment;

FIGS. 8A to 8D are cross-sectional views sequentially showing a manufacturing process of a semiconductor device, according to the third embodiment;

DETAILED DESCRIPTION

Figure 2A:
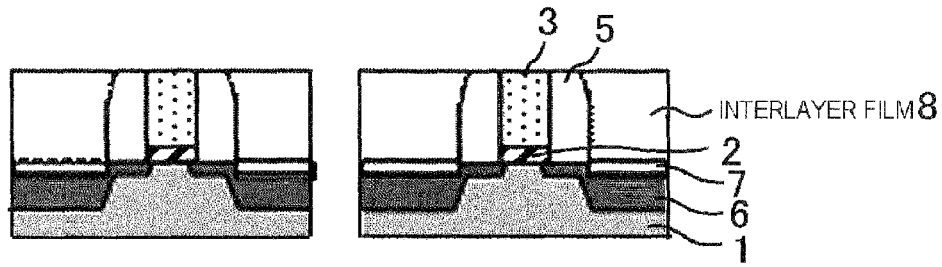
FIGS. 2A to 2E are cross-sectional views sequentially showing a manufacturing process of a semiconductor device, according to the first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereafter, exemplary embodiments of a method of manufacturing a semiconductor device according to the present invention will be described in details, referring to the accompanying drawings. The embodiments represent the case where polycrystalline silicon is employed as a silicon layer, a HfSiON layer formed on a base oxide layer of 1.5 nm as a gate insulating layer, and Ni as a metal for forming a FUSI electrode. Other suitable materials include non-crystalline silicon for the silicon layer, a high-k gate insulating layer containing Hf, such as $HfO_2$, HfON, HfLaON, for the gate insulating layer, and Pt and Pd for the metal for forming the FUSI electrode. In all the drawings, same constituents are given the same numeral, and the description thereof will not be repeated.

First Embodiment

Referring to FIGS. 1A to 1E, a method of manufacturing a semiconductor device according to a first embodiment of the present invention will be described hereunder.

An oxide layer that serves as the base of a high-k gate insulating layer 2 is formed on a Si substrate 1 in a thickness of 1.0 nm by a thermal oxidation process, and a CVD process is performed so as to deposit a HfSiO layer in a thickness of 2.0 nm. The HfSiO layer is nitrided though a plasma nitriding process, to thereby form a HfSiON gate insulating layer 2 (FIG. 1A).

Then a polycrystalline silicon layer 3 is deposited on the gate insulating layer 2 in a thickness of 100 nm, and a nitride layer of 50 nm in thickness is formed as a hard mask 4 to be employed for processing the gate (FIG. 1B).

After performing a lithography process with a resist so as to process the hard mask 4, the polycrystalline silicon layer 3 and the gate insulating layer 2 are subjected to an etching process, with the hard mask 4 (FIG. 1C).

After forming an oxide layer offset spacer of a thickness of 8 nm, implantation of an extension pocket, activation, and formation of an oxide layer sidewall 5 of a thickness of 40 nm are sequentially performed. Then ion implantation is performed so as to form a source/drain region, and a spike anneal process is performed at a temperature of 1000° C. or higher for another activation, to thereby form a source/drain region 6 (FIG. 1D).

After removing a natural oxide layer from the source/drain region 6, a sputtering process is performed to deposit Ni in a thickness of 8 nm, and heat treatment is applied so as to form a Ni silicide 7 of approximately 20 nm in thickness in the source/drain region. At this moment, the hard mask 4 of the nitride layer covering the polycrystalline silicon of the gate inhibits formation of a silicide (FIG. 1E).

Then an interlayer film 8, constituted of an oxide layer of a thickness of 300 nm or higher, is formed all over and planarized by a CMP process, and an overall etch-back process may be performed if necessary, so as to expose an upper portion of the polycrystalline silicon layer 3 of the gate, with the source/drain region 6 being covered with the interlayer film 8. At this moment, the nitride layer employed as the hard mask is also removed, either in the CMP process or the overall etch-back process (FIG. 2A).

Figure 2B:
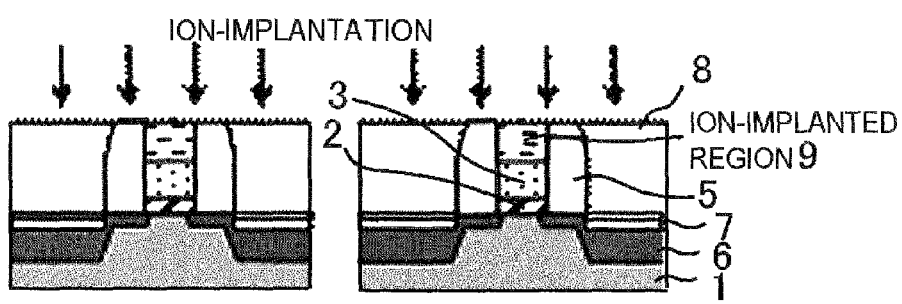

Under the state as shown in FIG. 2A, impurity ion implantation is performed in order to control the composition of the crystalline phase of the FUSI electrode. In this embodiment, B is implanted into the polycrystalline silicon of the gate in a concentration of $1\times10^{16}$ $cm^{-2}$, at an acceleration voltage of 1 keV. The source/drain region 6 is exempted from the effect of the impurity implantation, because of being covered with the interlayer film 8 constituted of the oxide layer. A majority of the B thus implanted into the polycrystalline silicon layer 3 is present in an ion-doped region 9, within a depth of 50 nm from the surface thereof (FIG. 2B).

Figure 2C:
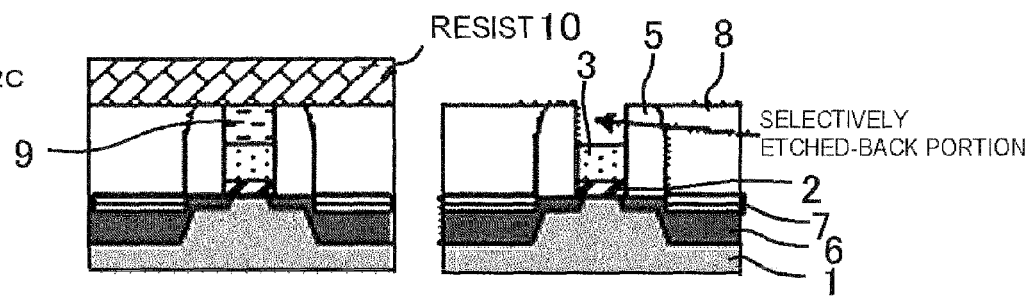

Then only the NMOS side is covered with a resist 10 by a lithography process, and the polycrystalline silicon layer 3 is selectively etched with respect to the oxide layer. The etching depth is set at a depth equal to or deeper than the range where the implanted ion seed is present in high concentration. In this embodiment, the etching depth is set at 50 nm. It is to be noted that an activation process or other heat treatment of approximately 400° C. or higher has to be avoided, during the process from the impurity implantation to the selective etching. This is because keeping the device from being subjected to a heat treatment prevents the B from diffusing in the polycrystalline silicon, thereby detaining the B in the originally implanted region, and hence the selective etching process can remove the majority of the B. The activation process referred to above includes, generally, a heat treatment of 900° C. or higher that causes the impurity implanted into the silicon to act as a donor or an accepter. Through the foregoing process the majority of the element implanted into the polycrystalline silicon layer 3 on the PMOS side is removed, and a substantially non-doped polycrystalline silicon 3 (50 nm) remains. Meanwhile on the NMOS side, the polycrystalline silicon layer 3 is turned into a stacked structure of a layer 9 (50 nm) where the impurity is present in high concentration and a layer 3 (50 nm) which is substantially non-doped (FIG. 2C).

Figure 2D:
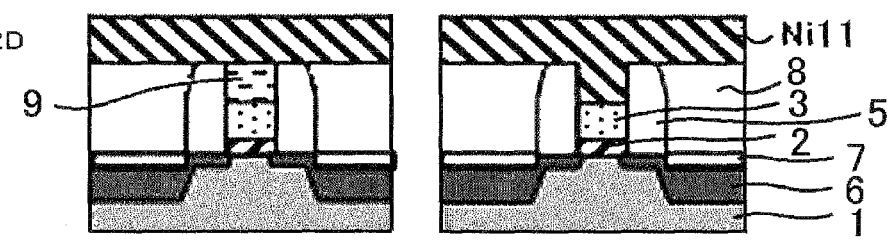

After removal of the resist 10, followed by a preparatory process of removing the natural oxide layer on the surface of the polycrystalline silicon, Ni 11 that serves as the metal for full silicidation is deposited up to a thickness of 80 nm at room temperature. The Ni 11 of 80 nm corresponds to the amount that gives, upon being entirely reacted with the 50 nm of polycrystalline silicon, a Ni silicide containing Ni and Si in a ratio of approximately 3:1 (FIG. 2D).

Figure 2E:
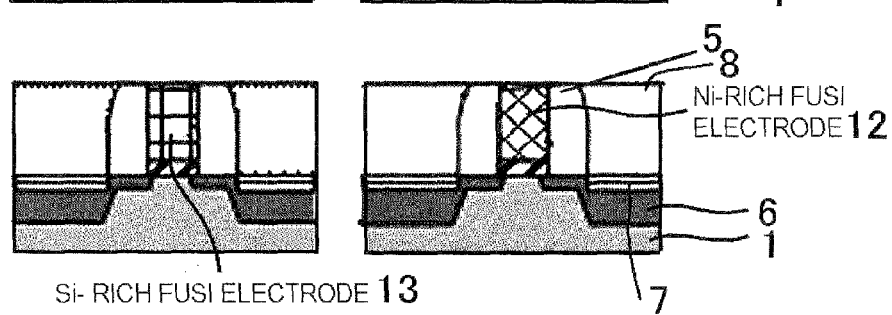

Then a heat treatment process is performed so as to fully silicide the gate polycrystalline silicon, after which the residual unreacted Ni is removed by an etching process using aqueous solution containing sulfuric acid and hydrogen peroxide (FIG. 2E). The heat treatment is executed at 350° C. for 5 minutes in $N_2$ atmosphere.

On the PMOS side, substantially the total amount of the Ni of 80 nm was reacted with the undoped polycrystalline silicon 3, to thereby give Ni-FUSI 12 containing Ni and Si in a ratio of approximately 3:1, and it was confirmed by X-ray diffraction that the silicide phase was $Ni_{31}Si_{12}$. The FUSI gate electrode obtained through such silicidation reaction expands in volume to approximately twice as large as the original polycrystalline silicon, and hence the height of the electrode returns to approximately 100 nm, which is generally the same as the height on the NMOS side.

In the case where the selective etch-back process is not performed on the PMOS-side polycrystalline silicon, not only the Ni located right upon the gate but also the Ni in a peripheral region is involved in the reaction as shown in FIG. 3(*i*). Then the FUSI electrode, upon expanding to a double volume, is forced to laterally expand because the upper face thereof is suppressed by unreacted Ni, and push the sidewall outside thus destroying the device (FIG. 3(*iii*)). In contrast, in the case where the selective etch-back process is performed so as to form the downwardly recessed portion as shown in FIG. 3(*ii*), the given silicide is smaller in volume than the total of the Ni and the polycrystalline silicon before the reaction, and hence the space created from the consumption of Ni can absorb the increase in volume because, which suppresses an increase in stress originating from the increase in volume, thereby preventing destruction of the device (FIG. 3(*iv*)).

Meanwhile, on the NMOS side a two-layer structure 13, composed of a NiSi layer on the side of the surface and a $NiSi_2$ layer on the side of the interface with the gate insulating layer, was formed through the same heat treatment. Presumably this is because not the entirety of the Ni of 80 nm was reacted with Si since the B present in the polycrystalline silicon suppresses the silicidation reaction, and also because the B is piled up on the interface between the silicide and the polycrystalline silicon with the progress of the silicidation, thereby exerting greater impact on the lower side of the polycrystalline silicon.

It has been proven that in order to cause B to adequately suppress the silicidation reaction it is necessary to implant B in a concentration of $8 \times 10^{15}$ $cm^{-2}$ or higher, into the polycrystalline silicon layer of 100 nm in thickness.

The temperature of the heat treatment for full silicidation may be appropriately determined in a range of 300° C. to 400° C. It is to be noted, however, that at a temperature of 350° C. or lower the silicidation reaction does not adequately take place on the PMOS side, and hence the FUSI electrode turns to a $Ni_2Si$ phase. To avoid such result it is preferable to extend the duration of the heat treatment. On the other hand, at 350° C. or higher, the silicidation on the NMOS side proceeds excessively, thereby turning the $NiSi_2$ phase into a NiSi phase. To avoid this, it is preferable to shorten the duration of the heat treatment.

Thus, it has been confirmed that under an optimized heat treatment condition, B effectively serves to form a Ni silicide having more silicon-rich composition than NiSi. Such effect is also obtainable with other elements to be implanted such as As, Sb, $BF_2$, F, P, Ge in addition to B, however the implantation concentration and the heat treatment condition have to be optimized in each of the cases. The acceleration voltage of the implantation should be determined taking into consideration that a majority of the implanted impurity has to be removed by the selective etch-back process on the PMOS side, and that it is desirable that the polycrystalline silicon remaining after the etch-back process attains, upon completion of the full silicidation, generally the same height as that of the FUSI electrode on the NMOS side. In this embodiment, since it is preferable to perform the etch-back process to a depth of 50 nm, which is half a thickness of the original polycrystalline silicon layer, it is preferable to determine the acceleration voltage such that the impurity is implanted into a depth of 50 nm or less.

Also, in case where the impurity implanted into the gate polycrystalline silicon layer is diffused throughout the polycrystalline silicon because of the heat treatment, the effect of the present invention may be degraded. Accordingly, it is preferable to execute the implantation at such a timing that can the heat treatment is not included between the implantation and the etch-back process. More specifically, it is preferable to execute the implantation, as this embodiment, immediately after exposing the polycrystalline silicon of the gate.

Through the foregoing composition control, the effective work function of the NMOS and PMOS FUSI gate electrode becomes 4.4 eV and 4.8 eV respectively, which means reduction in threshold voltage of approximately 0.1 V for the NMOS and approximately 0.3 V for the PMOS, in comparison with an ordinary NiSi electrode (effective work function 4.5 eV).

The essential advantage of the present invention described in this embodiment lies in that both of the impurity implantation status and the thickness of the gate silicon layer can be defined through a single lithography process, when respectively defining the Ni silicide composition of the NMOS and the PMOS. Separately performing the lithography process for the impurity implantation and the selective etch-back process of the PMOS gate silicon incurs the disadvantage of increase in number of manufacturing steps. Another disadvantage is that in the vicinity of the boundary between the NMOS region and the PMOS region, two boundaries are separately defined, namely the boundary of the impurity distribution and that of the height of the gate silicon. Therefore, upon completion of the full silicidation, the gate structure around the boundary becomes irregular, depending on the positional relationship of the two boundaries (FIGS. 4A, 4B).

Unlike the above, this embodiment provides, in addition to the obvious merit of reducing the number of manufacturing steps, the advantage that the gate structure remains stable with only a practically negligible gap in height after the full silicidation, because the boundary of the impurity distribution coincides with that of the height of the gate silicon.

Second Embodiment

This embodiment further includes a pre-doping process, after the deposition of the polycrystalline silicon layer on the gate insulating layer in the process of the first embodiment. Referring to FIGS. 5A to 6E, such process will be described hereunder.

After forming the gate insulating layer 2 and the polycrystalline silicon layer 3 as in the first embodiment (FIG. 5A), an impurity 1 is ion-implanted into the entire surface of the polycrystalline silicon to thereby form an impurity-doped region, without performing a lithography process (FIG. 5B). In this embodiment, As is implanted at 10 keV acceleration voltage and in $3\times10^{15}$ cm$^{-2}$ concentration. Thereafter, similar process to the first embodiment is performed so as to process the gate with the hard mask 4, formation of the source/drain region 6, and formation of the sidewall 5. Those processes include heat treatment processes such as the activation of the source/drain impurity (generally 900° C. or higher) and substrate heating for forming the sidewall (generally 400° C. to 800° C.), and hence the As implanted as impurity is diffused throughout the entire polycrystalline silicon (FIG. 5D).

Then similar steps to those of the first embodiment are performed, and after exposing the upper surface of the polycrystalline silicon (FIG. 6A), another impurity 2 which is different from the impurity 1 is ion-implanted to thereby form an impurity-doped region 18 (FIG. 6B). In this embodiment, B is implanted at an acceleration voltage of 1 keV and in a concentration of $1\times10^{16}$ cm$^{-2}$. As already stated, it is important to exclude the activation process or other heat treatment of approximately 400° C. or higher, from the process between this impurity implantation and the selective etching process.

Thereafter, as the first embodiment, the selective etching process is performed only on the polycrystalline silicon on the PMOS side (FIG. 6C), and the Ni 11 (80 nm) is deposited (FIG. 6D). This is followed by one minute of heat treatment at 450° C. in a N$_2$ atmosphere, for full silicidation, after which unreacted Ni is removed by an etching process (FIG. 6E).

On the PMOS side, substantially the total amount of the Ni of 80 nm was reacted with the As-doped polycrystalline silicon, to thereby give Ni-FUSI containing Ni and Si in a ratio of approximately 3:1, and it was confirmed by X-ray diffraction that the silicide phase is Ni$_3$Si. The Ni$_3$Si expands in volume to approximately twice, as the Ni$_{31}$Si$_{12}$ of the first embodiment, and hence the height of the electrode returns to approximately 100 nm, which is generally the same as the height on the NMOS side. The advantage of the first embodiment, such as suppression of increase in stress originating from the expansion in volume, which prevents destruction of the device, can equally be attained. On the NMOS side, also as in the first embodiment, a two-layer structure, composed of a NiSi layer on the surface side and a NiSi$_2$ layer on the gate insulating layer interface side, was formed.

The difference between this embodiment and the first embodiment lies in that As is implanted as the impurity 1 into the polycrystalline silicon on the PMOS side to be selectively etched back, and that the impurity 1 (As) is implanted into a lower portion of the polycrystalline silicon on the NMOS side, and impurity 1 (As) as well as the impurity 2 (B) are implanted into an upper portion thereof. The impurity 2 (B) in the upper layer on the NMOS side serves to suppress the silicidation reaction with Ni, as in the first embodiment. The impurity 1 (As) contained in both of the NMOS and PMOS sides has a low dosage as $3\times10^{15}$ cm$^{-2}$, and hence the As alone cannot suppress the silicidation reaction to such an extent as inhibiting the formation of the Ni-rich silicide on the PMOS side. However, in the case where the B is present on the NMOS side together with the As, the As promotes the suppressing effect of the B against the silicidation reaction, thereby facilitating stably forming the NiSi$_2$ phase in the lower portion of the polycrystalline silicon layer, which is undoped according to the first embodiment. Therefore, in this embodiment the heat treatment of 450° C. still allows forming the NiSi$_2$ phase, and applying thus the higher temperature allows shortening the duration of the heat treatment.

In this embodiment, as already stated, the impurity 1 should not be implanted in such high concentration that disturbs formation of a Ni-rich silicide phase. More specifically, it is preferable that the concentration of the impurity 1 for the polycrystalline silicon of 100 nm in thickness does not exceed $6\times10^{15}$ cm$^{-2}$. Acceptable impurity concentration varies according to the film thickness, for example a preferable concentration of the impurity 1 for the polycrystalline silicon of 50 nm in thickness is $3\times10^{15}$ cm$^{-2}$ or less.

It is desirable that a similar amount of impurity to that of the first embodiment is present, in order to form the NiSi$_2$ phase on the NMOS side, and hence it suffices that the total of the impurity 1 and the impurity 2 reaches $8\times10^{15}$ cm$^{-2}$ or higher. For example, in the case where the impurity 1 is implanted in a concentration of $3\times10^{15}$ cm$^{-2}$, it is preferable to implant $5\times10^{15}$ m$^{-2}$ or more of the impurity 2.

The temperature of the heat treatment for full silicidation may be appropriately determined in a range of 350° C. to 500° C. As in the first embodiment, on the lower side the silicidation reaction may not adequately take place on the PMOS side, while on the higher side the silicidation on the NMOS side may proceed excessively. To avoid this, it is preferable to adjust the duration of the heat treatment.

Third Embodiment

This embodiment describes an example of composition control with respect to a Ni silicide gate electrode, in the case where As is included as the impurity element implanted after exposing the upper surface of the polycrystalline silicon, referring to FIGS. 7A to 8D.

The process up to exposing the upper surface of the polycrystalline silicon layer is the same as the first embodiment, and hence the description is not repeated. After exposing the upper surface of the polycrystalline silicon layer 3 (FIG. 7A), impurity ion implantation is executed for controlling the composition of the crystalline phase of the FUSI electrode. In this embodiment, As is implanted in a concentration of $3\times10^{15}$ cm$^{-2}$ and at an acceleration voltage 10 keV, into the polycrystalline silicon of the gate. A majority of the As thus implanted into the polycrystalline silicon is present within a depth of 50 nm from the surface thereof (As-doped region 20 in FIG. 7B). As already stated, it is important to exclude the activation process or other heat treatment of approximately 400° C. or higher, from the process between this impurity implantation and the selective etching process.

Figure 7A:
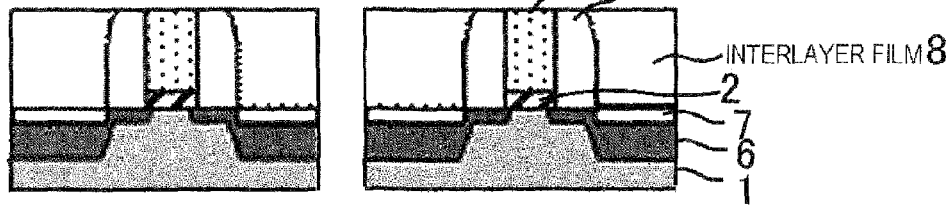
FIGS. 7A to 7D are cross-sectional views sequentially showing a manufacturing process of a semiconductor device, according to a third embodiment of the present invention.
Figure 7B:
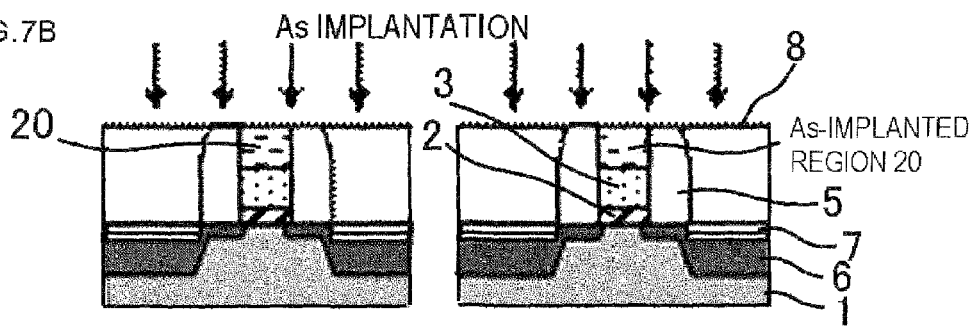
Figure 7C:
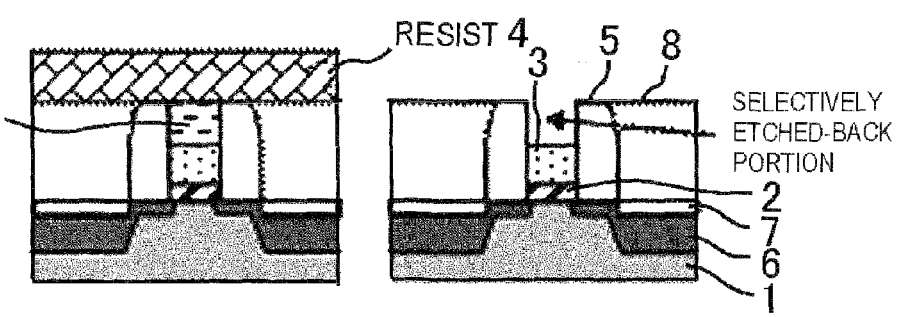
Figure 7D:
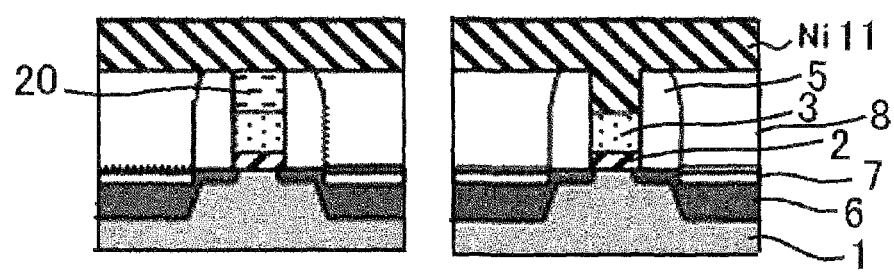

Then similar steps to these of the first embodiment are performed to remove a majority of the As on the PMOS side by the selective etch-back process (50 nm) on the polycrystalline silicon on the PMOS side (FIG. 7C), and to deposit Ni by sputtering to a thickness of 80 nm, after removing the natural oxide layer on the surface (FIG. 7D).

The above is followed by heat treatment for forming the Ni-FUSI, which includes three stages in this embodiment. A first heat treatment is performed for two minutes at 310° C. in a N$_2$ atmosphere, so as to form Ni$_2$Si of approximately 70 nm in thickness on the NMOS side. At this moment, approximately 50 nm of unreacted polycrystalline silicon remains in the lower layer, while on the PMOS side substantially the total amount of the polycrystalline silicon is reacted, thereby also giving $Ni_2Si$. In such case where the impurity is absent or the concentration thereof is low, $Ni_2Si$ 16 is formed under a low temperature such as 300° C. (FIG. 8A).

After cooling, a second heat treatment is performed for 30 seconds at 200° C. in an atmosphere of $N_2/O_2=4/1$, without exposing to open atmosphere. Through such heat treatment at a low temperature in an atmosphere containing oxygen, an oxide layer 17 is formed in a thickness of approximately 5 nm on the surface of the silicide containing As on the NMOS side. This is because a scarce amount of As remaining on the surface of the $Ni_2Si$ serves to facilitate formation of the oxide layer on the silicide surface. Under such low temperature, the oxide layer is barely formed on the PMOS side where As is absent. Although the Ni remaining unreacted may also be oxidized, only the superficial portion is slightly oxidized under such low temperature (FIG. 8B). If the specimen is opened to the atmosphere during the cooling down after the first heat treatment, the specimen is exposed to air while the specimen is not yet sufficiently cooled, which may unintentionally incur a situation like the second heat treatment. Accordingly, it is preferable to successively execute the first heat treatment and the second heat treatment without exposure to air.

Then a third heat treatment is successively performed for one minute at 450° C. in a $N_2$ atmosphere, without removing the unreacted Ni. On the NMOS side, the unreacted Ni is not likely to be newly reacted since the oxide layer is interposed between the Ni and the $Ni_2Si$, and hence the unreacted polycrystalline silicon is reacted with the $Ni_2Si$ thereby giving a NiSi phase 22 which is more stable under this temperature range, and thus the full silicidation is completed. Meanwhile on the PMOS side, since the oxide layer, which disturbs the reaction between the unreacted Ni and the $Ni_2Si$, is scarcely present, a $Ni_3Si$ phase 21 which is even more Ni-rich is produced, and thus the full silicidation is also completed (FIG. 8C). Upon removing the unreacted Ni with aqueous solution containing sulfuric acid and hydrogen peroxide at this stage, a NiSi-FUSI electrode is obtained on the NMOS side, and a $Ni_3Si$-FUSI electrode on the PMOS side (FIG. 8D).

The oxide layer on the surface of the NMOS side FUSI electrode is quite thin, and can be easily removed leaving the interlayer film and the sidewall, by a total etch-back process. The three stages of the foregoing heat treatment may be successively performed.

In this embodiment, since a higher concentration of the As leads to formation of a thicker oxide layer, it is preferable implant $2\times10^{15}$ cm$^{-2}$ or more of As, to thereby provoke adequate suppressing effect against the silicidation on the NMOS side.

Whereas As is employed as the element to be implanted in this embodiment, no other impurity than As has been found to promote formation of the oxide layer, and hence other impurity elements are not suitable for this embodiment.

It is preferable to perform the first heat treatment at a temperature of 330° C. or lower, because this stage is intended for forming the $Ni_2Si$ phase.

The temperature of the second heat treatment may be appropriately determined in a range of 150° C. to 250° C., however on the lower side the oxide layer may not grow on the NMOS side either, while on the higher side a thick oxide layer may be formed also on the PMOS side, which may suppress the silicidation during the third heat treatment. It is essential, therefore, to find the optimum temperature. The atmosphere for the second heat treatment is not limited to $N_2/O_2=4/1$, however, as with the temperature, if the $O_2$ concentration is too low the oxide layer may not grow on the NMOS side either, and if the $O_2$ concentration is too high a thick oxide layer may be formed also on the PMOS side, which may suppress the silicidation during the third heat treatment. It is essential, therefore, to find the optimum concentration.

It is preferable to perform the third heat treatment at 400° C. or higher, because this stage is intended for sufficiently promoting the full silicidation on the PMOS side.

Fourth Embodiment

This embodiment further includes a pre-doping process, immediately after the deposition of the polycrystalline silicon layer in the process of the third embodiment. Referring to FIGS. 9A to 10D, such process will be described hereunder.

Through similar steps to those of the second embodiment are performed, until reaching the state corresponding to FIG. 6A. At this stage, a difference from the second embodiment is that B is employed as the first impurity to be implanted. In this embodiment, B is implanted at an acceleration voltage of 1 keV in a concentration of $3\times10^{15}$ cm$^{-2}$ (B-doped region 23 in FIG. 9A).

Figure 9A:
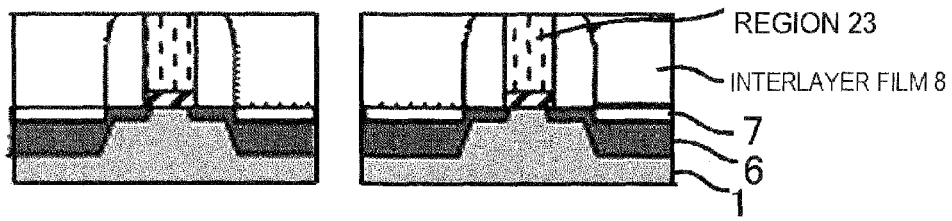
FIGS. 9A to 9D are cross-sectional views sequentially showing a manufacturing process of a semiconductor device, according to a fourth embodiment of the present invention.
Figure 9B:
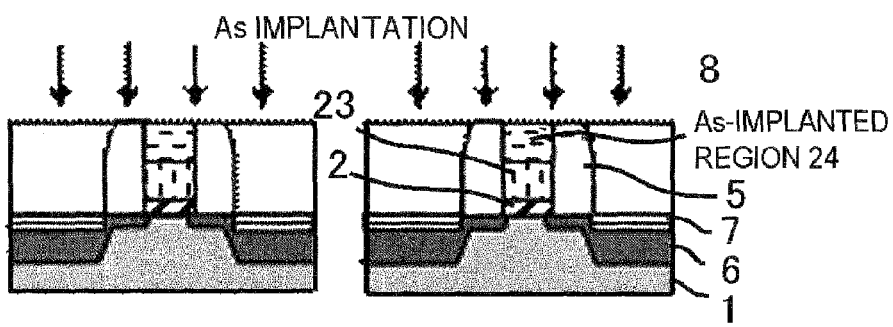
Figure 9C:
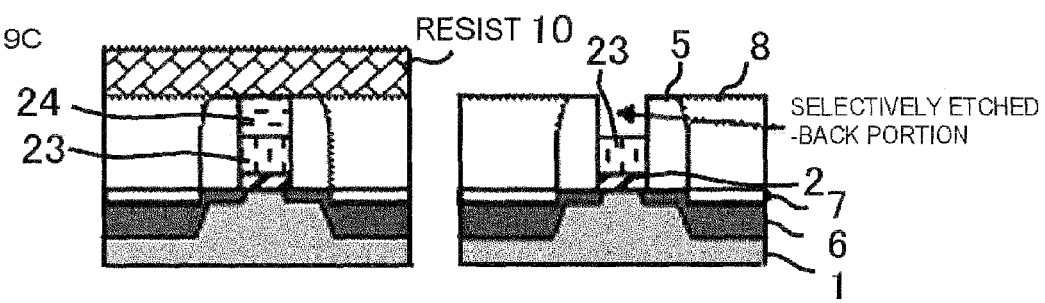

Then similar steps to those of the third embodiment are performed, and As is implanted as the second impurity into the polycrystalline silicon of the gate in a concentration of $3\times10^{15}$ cm$^{-2}$ and at an acceleration voltage of 10 keV (As-doped region 24 in FIG. 9B). As already stated, it is important to exclude the activation process or other heat treatment of approximately 400° C. or higher, from the process between this impurity implantation and the selective etching process.

Figure 9D:
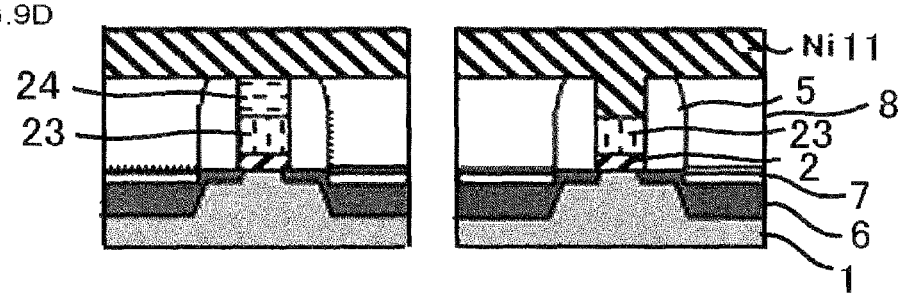

Again, similar steps to these of the first embodiment are performed to remove a majority of the As on the PMOS side by the selective etch-back process (50 nm) on the polycrystalline silicon on the PMOS side (FIG. 9C), and to deposit Ni by sputtering to a thickness of 80 nm, after removing the natural oxide layer on the surface (FIG. 9D).

Figure 10A:
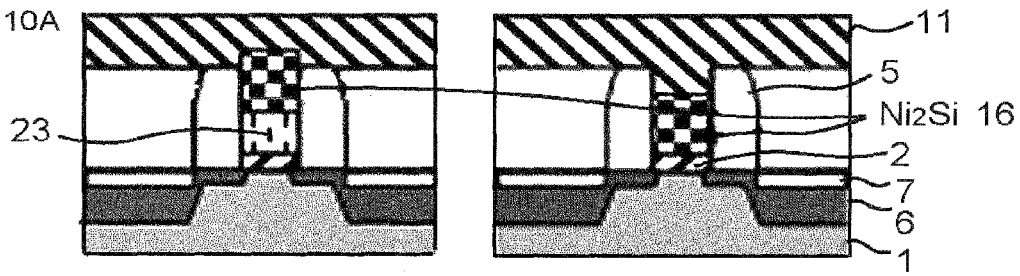
FIGS. 10A to 10D are cross-sectional views sequentially showing a manufacturing process of a semiconductor device, according to the fourth embodiment.
Figure 10B:
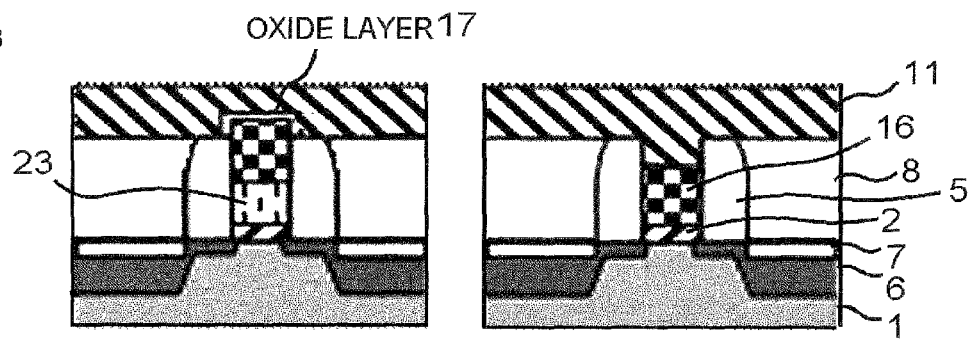

The above is followed by heat treatment for forming the Ni-FUSI, which includes three stages as the third embodiment. The first heat treatment is performed for two minutes at 310° C. in a $N_2$ atmosphere, so as to form $Ni_2Si$ of approximately 70 nm in thickness on the NMOS side. At this moment, approximately 50 nm of unreacted polycrystalline silicon remains in the lower layer, while on the PMOS side substantially the total amount of the polycrystalline silicon is reacted, thereby also giving $Ni_2Si$. Although the impurity is present in both of the NMOS and PMOS sides in this embodiment, $Ni_2Si$ 16 is formed under a low temperature such as 300° C. when the impurity concentration is relatively low, as stated in the third embodiment (FIG. 10A).

After cooling, the second heat treatment is performed for 30 seconds at 200° C. in an atmosphere of $N_2/O_2=4/1$, without exposing to open atmosphere. Through such heat treatment, the oxide layer 17 is formed in a thickness of approximately 5 nm only on the surface of the silicide containing As on the NMOS side. In contrast, the oxide layer is barely formed on the PMOS side, where As is absent.

Figure 10C:
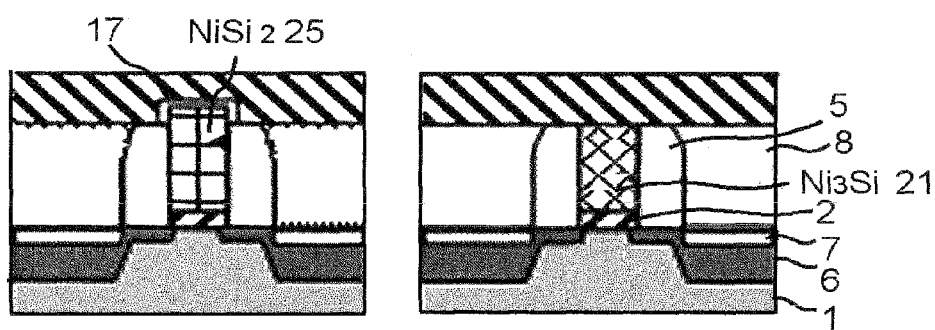
Figure 10D:
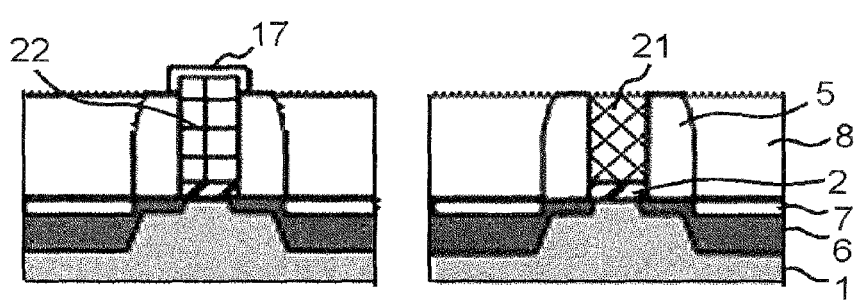

Then the third heat treatment is successively performed for one minute at 450° C. in a $N_2$ atmosphere, without removing the unreacted Ni. In this embodiment, since B is present in the unreacted polycrystalline silicon on the NMOS side, $Ni_2Si$ is reacted with the unreacted B-doped polycrystalline silicon to thereby give a $NiSi_2$ phase 25 instead of a NiSi phase, and thus the full silicidation is completed. Meanwhile on the PMOS side, since the oxide layer, which disturbs the reaction between the unreacted Ni and the $Ni_2Si$, is scarcely present, and also because only a relatively low concentration of B is present, the $Ni_3Si$ phase 21 which is even more Ni-rich is produced, and thus the full silicidation is also completed (FIG. 10C). Upon removing the unreacted Ni with aqueous solution containing sulfuric acid and hydrogen peroxide at this stage, a $NiSi_2$-FUSI electrode is obtained on the NMOS side, and a $Ni_3Si$-FUSI electrode on the PMOS side (FIG. 10D).

The oxide layer on the surface of the NMOS side FUSI electrode is quite thin, and can be easily removed leaving the interlayer film and the sidewall, by a total etch-back process.

In this embodiment, since a higher concentration of the As serving as the second impurity leads to formation of a thicker oxide layer, it is preferable implant $2 \times 10^{15}$ $cm^{-2}$ or more of As, to thereby provoke adequate suppressing effect against the silicidation on the NMOS side.

Whereas As is employed as the second impurity to be implanted in this embodiment, no other impurity than As has been found to promote formation of the oxide layer, and hence other impurity elements are not suitable for this embodiment.

Elements that may be implanted as the first impurity include Sb, $BF_2$, F, P, and Ge, in addition to B. It is preferable to set the concentration at $6 \times 10^{15}$ $cm^{-2}$ or less for the polycrystalline silicon of 100 nm in thickness because, as stated in the second embodiment, the concentration should not be as high as disturbing formation of the Ni-rich silicide phase. Acceptable impurity concentration varies depending on the film thickness.

It is preferable to perform the first heat treatment at a temperature of 330° C. or lower, because this stage is intended for forming the $Ni_2Si$ phase.

The temperature of the second heat treatment may be appropriately determined in a range of 150° C. to 250° C., however on the lower side the oxide layer may not grow on the NMOS side either, while on the higher side a thick oxide layer may be formed also on the PMOS side, which may suppress the silicidation during the third heat treatment. It is essential, therefore, to find the optimum temperature. The atmosphere for the second heat treatment is not limited to $N_2/O_2=4/1$, however, as with the temperature, if the $O_2$ concentration is too low the oxide layer may not grow on the NMOS side either, and if the $O_2$ concentration is too high a thick oxide layer may be formed also on the PMOS side, which may suppress the silicidation during the third heat treatment. It is essential, therefore, to find the optimum concentration.

It is preferable to perform the third heat treatment at 400° C. or higher, because this stage is intended for sufficiently promoting the full silicidation on the PMOS side.

Through the foregoing passages the embodiments of the present invention have been described referring to the drawings, however those are merely examples of the present invention and various modifications may be made without departing from the scope of the present invention.

For example, although HfSiON is employed as the gate insulating layer in the foregoing embodiments, other materials may be employed instead.

It is apparent that the present invention is not limited to the above embodiment, and may be modified and changed without departing from the scope and spirit of the invention.

What is claimed is:

1. A method of manufacturing a semiconductor device comprising a PMOS transistor and a NMOS transistor, comprising:

forming a silicon layer over a substrate through a gate insulating film;

forming a first gate electrode and second gate electrode by patterning said silicon layer, said first gate electrode being a gate electrode of said NMOS transistor, and said second gate electrode being a gate electrode of said PMOS transistor;

forming an interlayer film covering said first and said second gate electrodes;

planarizing said interlayer film;

removing an upper portion of said planarized interlayer film to expose said silicon layer of said first and said second gate electrodes;

simultaneously introducing impurity for controlling composition of a silicide phase, into said exposed upper portion of said silicon layer of said first and said second gate electrode respectively;

selectively removing said exposed upper portion of said second gate electrode having the introduced impurity, out of said first and said second gate electrodes;

forming a metallic layer formed of a metal capable of forming a silicide over said silicon layer of said selectively removed second gate electrode and said silicon layer of said first gate electrode;

performing a heat treatment such that a silicide layer of said metallic layer is formed; and removing an unreacted portion of said metallic layer after said heat treatment process.

2. The method according to claim 1, wherein said introducing impurity for controlling composition of a silicide phase into said silicon layer is executed between said removing an upper portion of said interlayer film and said selectively removing an upper portion of said second gate electrode.

3. The method according to claim 2, wherein said introducing impurity for controlling composition of a silicide phase into said silicon layer excludes a heat treatment process that diffuses said impurity.

4. The method according to claim 1, wherein said introducing impurity for controlling composition of a silicide phase includes introducing said impurity in high concentration into said silicon layer to a depth corresponding to equal to or more than 0 and equal to or less than 0.5 times of a thickness of said silicon layer from a surface thereof, and said selectively removing includes removing a portion of said silicon layer containing said impurity of said high concentration.

5. The method according to claim 1, wherein said impurity for controlling composition of said silicide phase includes at least one selected from the group consisting of As, P, Sb, B, $BF_2$, and F.

6. The method according to claim 5, wherein said impurity for controlling composition of said silicide phase is B, and an implantation amount thereof is equal to or more than $8 \times 10^{15}$ $cm^{-2}$ in surface density.

7. The method according to claim 1, wherein said introducing impurity for controlling composition of a silicide phase into said silicon layer includes:

introducing a first impurity into said silicon layer between said forming a silicon layer and said forming an interlayer film, and diffusing said first impurity throughout an entirety of said silicon layer by a heat treatment process; and introducing a second impurity into said silicon layer between said entirely removing and said selectively removing;

wherein said introducing a second impurity excludes diffusing said second impurity.

8. The method according to claim 7, wherein said introducing a second impurity includes introducing said second impurity in high concentration into said silicon layer to a depth corresponding to equal to or more than 0 and equal to or less than 0.5 times of a thickness of said silicon layer from a surface thereof; and said selectively removing includes removing a portion of said silicon layer containing said impurity of said high concentration.

9. The method according to claim 7, wherein said heat treatment process to diffuse said first impurity is an impurity activation process.

10. The method according to claim 7, wherein said first and said second impurity for controlling composition of said silicide phase are different from each other, and respectively include at least one selected from the group consisting of As, P, Sb, B, $BF_2$, and F.

11. The method according to claim 10, wherein said first impurity for controlling composition of said silicide phase includes As, and an implantation amount of As is equal to or less than $5 \times 10^{15}$ cm$^{-2}$ in surface density, and said second impurity includes B, and an implantation amount of B makes a total of equal to or more than $8 \times 10^{15}$ cm$^{-2}$ in surface density, including said implantation amount of As.

12. The method according to claim 1, wherein said gate insulating layer includes $HfSiON_x$ at least on an upper surface thereof.

13. The method according to claim 1, wherein said heat treatment process turns a region of said silicon layer of said gate electrode for said PMOS transistor in contact with said gate insulating layer into one of $Ni_3Si$ and $Ni_{31}Si_{12}$, and turns a region of said silicon layer of said gate electrode for said NMOS transistor in contact with said gate insulating layer into one of $NiSi_2$ and NiSi.

14. The method according to claim 1, comprising executing said heat treatment process at a temperature of 500° C. or lower.

15. The method according to claim 1, wherein said impurity for controlling composition of said silicide phase includes As, and said heat treatment process includes:
  a first heat treatment process that forms a first silicide phase;
  a second heat treatment process that forms an oxide layer only on a surface of said first silicide phase containing As;
  a third heat treatment process that forms a second silicide phase without removing an unreacted portion of said metallic layer; and
  removing said unreacted portion of said metallic layer, and further removing said oxide layer, after said third heat treatment process.

* * * * *